United States Patent [19]

Bertin et al.

[11] Patent Number: 4,583,201

[45] Date of Patent: Apr. 15, 1986

[54] RESISTOR PERSONALIZED MEMORY DEVICE USING A RESISTIVE GATE FET

[75] Inventors: Claude L. Bertin, South Burlington, Vt.; Harish N. Kotecha, Manassas, Va.

[73] Assignee: International Business Machines Corporation, Armonk, N.Y.

[21] Appl. No.: 530,451

[22] Filed: Sep. 8, 1983

[51] Int. Cl.$^4$ .............................................. G11C 17/00
[52] U.S. Cl. .................................... 365/104; 365/100
[58] Field of Search ................. 365/94, 100, 103, 104, 365/182, 183

[56] References Cited

U.S. PATENT DOCUMENTS

| | | | |
|---|---|---|---|
| 4,092,735 | 5/1978 | McElroy | 365/183 |
| 4,158,239 | 6/1979 | Bertin | 365/182 |

OTHER PUBLICATIONS

H. O. Askin, "Single Device Push-Pull Read-Only Storage Cell", IBM Tech. Disc. Bull., vol. 16, No. 5, Oct. 1973, p. 1642.

*Primary Examiner*—Joseph A. Popek
*Attorney, Agent, or Firm*—Sughrue, Mion, Zinn, Macpeak and Seas

[57] ABSTRACT

A resistor personalized memory cell consisting of a resistive gate field effect transistor. One end of the gate electrode is connected to the memory cell access line, the other end to one of its source or drain regions. The source or drain region not connected to the gate electrode is connected to the memory cell bit line. Memory cell personalization is accomplished by selecting the resistance of the resistive gate. Memory cell data is read by detecting the current flow through the cell, the magnitude of the current flow being proportional to the gate resistance.

4 Claims, 3 Drawing Figures

RESISTOR PERSONALIZED MEMORY DEVICE USING A RESISTIVE GATE FET

FIELD OF THE INVENTION

The invention relates to semiconductor memory devices and more particularly, to field effect transistor devices which function as memory cells at row and column intersections of a read only memory matrix.

BACKGROUND OF THE INVENTION

The storage of fixed programs in digital computing systems is usually accomplished in fixed memories known as read only memories (ROM) or as they are sometimes calld read only stores (ROS). These memories are built in matrix form with multiple rows and columns, the memory devices or, as they are sometimes called, memory cells being located at the intersections of row and column lines. It is known that any of a number of electrical components may be used as the memory cell. For example, one of the earliest memory cells for ROMs was a resistor selectively connected to the intersections of the row and column lines. The bit status at each bit location was determined by the presence or absence of a resistance at the location. In initial stages of manufacture, resistors were located at each bit position to produce a conductive path between the row line and the intersecting column line. To program bit positions, the resistors at certain bit positions, selected by the fixed program, are removed, usually by a simple burnout process. This eliminates the row to column conductive path at the bit positions with burnt out resistors. The presence or absence of a conductive path at the bit position determines the bit status, that is, the logic level of the bit. This method of memory personalization is often called electrical personalization, for the personalization is accomplished with the application of electric energy to the memory matrix at the end of the manufacturing process. An example of a ROM with resistor elements as the memory cells is shown in U.S. Pat. No. 3,246,315 which issued Apr. 12, 1966 to C. W. Gear and is assigned to the assignee of the invention disclosed herein.

Diodes, PN junction trasistors and field effect transistors are also commonly used as memory cells in read only memories. While electrical personalization is available for memory cells comprised of diodes, PN junction transistors and field effect transistors, another form of personalization, is sometimes used. This personalization technique which involves altering device characteristics during the manufacturing process according to the data state desired has been successfully and advantageously used. Depending on the process involved, personalization may occur during the early stages of the manufacturing process, often called Front End Of the Line (FEOL) personalization or during late stages of the manufacturing process, called Back End Of the Line (BEOL) personalization. A ROM with field effect transistor memory cells personalized by device modification during manufacture is disclosed in U.S. Pat. No. 4,208,727 which issued to Redwine et al on June 17, 1980.

It is a continuing goal of those who manufacture read only stores to maximize the number of bits per memory chip while maintaining small chip size. It is also often desirable to hold off memory personalization until the latter stages of the manufacturing process to allow late changes in the fixed program to be incorporated into the memory.

OBJECTS OF THE INVENTION

It is an object of the invention to produce a read only store adapted for Back End Of the Line personalization.

It is a further object of the invention to produce a read only store in which either binary or multilevel data can be stored.

It is a still further object of the invention to have a read only store with a reduced number of circuit elements to thereby increase circuit-packing density.

SUMMARY OF THE INVENTION

These and other objects, features and advantages of the invention, as will become apparent from the detailed description of the preferred embodiment set forth hereinafter, are accomplished by a resistor personalized memory device using a resistive gate field effect transistor.

The memory cell of the invention is a resistive gate field effect transistor device, with one end of the gate connected to an access line for the memory cell and the other end of the gate connected to one of the source and drain regions of the field effect transistor. The other of the source and drain regions is connected to a data line for the memory cell. The presence of a predetermined voltage between access line and the data line causes current to flow between the said lines which is a function of the resistance of the resistive gate and the DC impedance of the channel region.

A ROS matrix array of individual resistive gate field effect transistors according to the invention is constructed. These memory cells store binary or other multilevel data according to the resistance values of the resistive gate field effect transistors. The resistance of a resistive gate field effect transistor can be controlled by selective doping through ion implantation at some late point in the manufacturing process.

DETAILED DESCRIPTION OF THE PREFERRED EMBODIMENT

Figure 1:
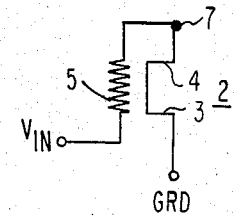
FIG. 1 is a schematic circuit diagram of a memory cell using a resistive gate field effect transistor according to the teachings of the invention.
Figure 2:
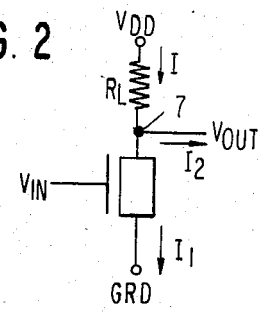
FIG. 2 is a circuit schematic showing an equivalent circuit for the resistive gate field effect transistor memory cell of the invention.

FIG. 1 is a schematic diagram of a memory cell constructed in accordance with the teachings of the invention. FIG. 2 is a schematic diagram of an equivalent circuit for the memory cell of FIG. 1. The memory cell is comprised of a resistive gate field effect transistor 2 having diffused regions 3, 4 formed in the substrate to create source and drain regions with a channel region therebetween. As is well known, the field effect transistor is a bilateral device with the region designated as the source and the region designated as the drain being interchangeable. The nomenclature used for these diffused regions is dependent on the direction of current flow through the channel. By convention, current flows from the drain to the source. Thus, in the configuration illustrated in FIG. 1, the source 3 of the field effect transistor 2 is connected to the circuit reference potential, ground GND. The device includes a resistive gate 5, one end of which is connected to the terminal $V_{IN}$ for receiving an input signal. The other end of the gate 5 is connected to node 7 and the drain 4. An input voltage to the terminal $V_{IN}$ of a value sufficient to overcome the device threshold voltage will cause the transistor 2 to conduct. That is so for the application of a sufficiently large input voltage to the gate 5 through the input terminal $V_{IN}$ creates an electric field in the channel region of the transistor 2 between the source 3 and drain 4 sufficient to overcome the threshold voltage and cause current to flow from the drain to the source.

With reference to the equivalent circuit of FIG. 2, the resistive gate field effect transistor memory cell may be viewed as an inverter circuit. If Vout is taken at node 7, the following relationships are true.

$$V_{out} = \frac{R_{FET}}{R_L + R_{FET}} \times V_{DD}$$

where:
$R_{FET}$ is the DC impedance of the channel of the FET.
$R_L$ corresponds to the resistance of the resistive gate.
When:
$R_L >> R_{FET}$ (FET is ON)
$V_{out} \doteq 0$ v.; and $I=I_1$.
When:
$R_L >> R_{FET}$ (FET is OFF)
$V_{out} \doteq V_{DD}$; and $I=I_2$.

Thus, the output current is a function of the value of the resistance $R_L$. Controlling the value of $R_L$ allows one to vary the values of the currents $I_1$ and $I_2$, which can be used as a measure of stored data. In the simplest case, $R_L$ is given either of two values such that the output current from a selected cell takes either of two values determined by $R_L$. Thus, a two-level or binary cell is created. If, for example, the value of the resistance $R_L$ is constructed so as to take on any of three preselected values, a trilevel or terciary device is realized.

Memory cell selection may be controlled by selectively controlling the conductive state of the FET. Thus, the memory cell is selected when the FET of the cell is turned on to allow current to flow through the gate resistance 5 of the resistive gate of the FET 2 and the channel region of the FET. If the memory cell of the invention is connected at an intersection of row and column lines of an ROS matrix, the terminal $V_{IN}$ may be connected to the access or word line and the source of the cell FET to the data or bit line. If the word lines then raise to the potential $V_{DD}$ and the bit line is lowered to ground potential, the transistor 2 will conduct.

In the resistive gate field effect transistor memory cell of the invention, the cell resistance is controlled by controlling the resistance of the resistive gate 5. Since the resistive gate is part of the field effect transistor itself, no additional resistive components are required. This assures small cell size. In addition, since known resistive gate field effect transistor fabrication techniques allow for determining the gate resistance during late stages of the fabrication process, BEOL personalization can be implemented.

Various conventional techniques for controlling the resistance of the resistive gate 5 can be utilized to fulfill the teachings of the invention. In the preferred embodiment of the invention, the resistive gate is fabricated of polycrystalline silicon. The resistance value of the polycrystalline silicon gate material can be varied by, for example, ion implantation. P. K. KO et al, Design and Performance of Resistive Gated MOSFETs for Analog Integrated Circuits, INTERNATIONAL ELECTRON DEVICES MEETING, pages 506–509, Dec. 5, 1979. As discussed in U.S. Pat. No. 4,158,239, which issued June 12, 1979 to Bertin and is assigned to the same assignee as the instant invention ion implantation carried out with n-type doping such as phosphorous at, for example, an acceleration energy from 75 to 100 KeV at a dosage of approximately $10^{15}$ atoms per square centimeter will provide a selective increase in the conductivity of the polycrystalline layer and thus selective variation in its resistance value. As is known to those skilled in the art, there are many techniques available for varying the resistance of a polycrystalline silicon layer. It should be noted that the scope of the invention is not limited to any specific technique or techniques for varying the resistance of the resistive gate in the memory cell of the invention.

Figure 3:
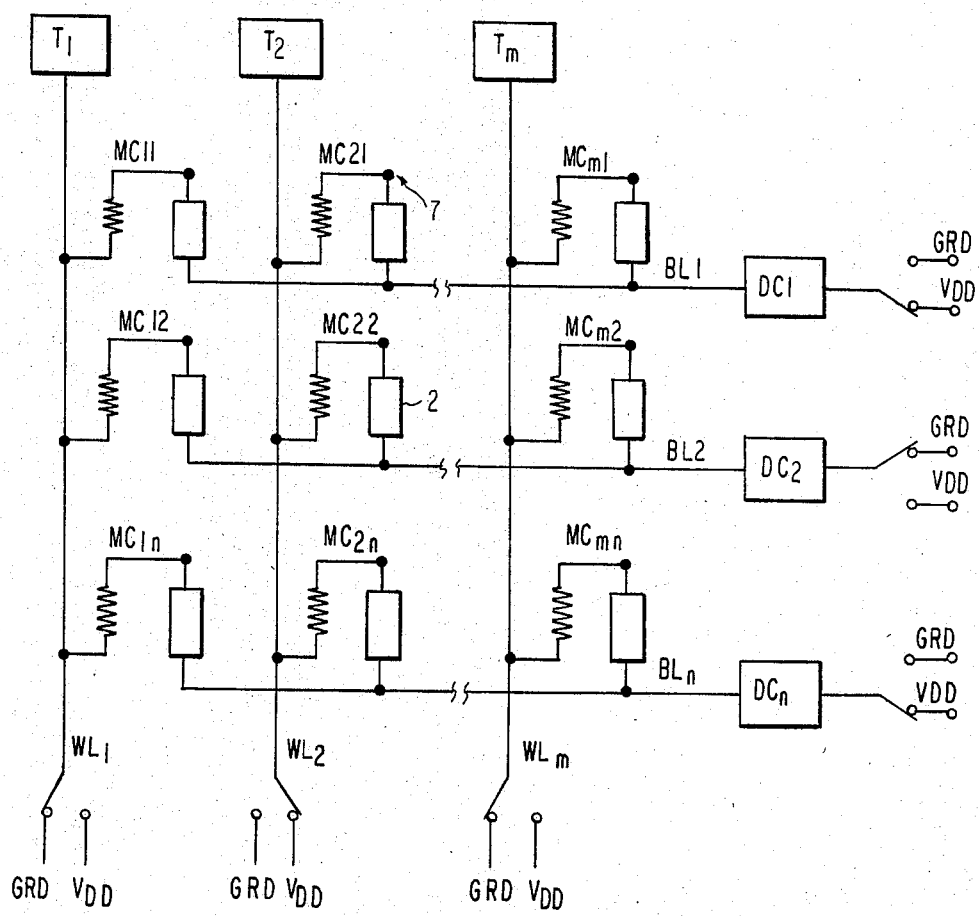
FIG. 3 is a schematic circuit diagram of a ROS array using the features of the invention.

FIG. 3 illustrates an ROS memory matrix comprised of memory cells according to the invention. The ROS matrix includes a plurality of word lines WL1 ... WLm and a plurality of intersecting bit lines BL1 ... BLn. The memory cells MC11, MC21, ... MCmn are arranged as shown at the intersection of word and bit lines. Each memory cell is comprised of a resistive gate field effect transistor according to the teachings of the invention. That is, the memory cell is composed of a resistive gate field effect transistor having a resistive gate whose resistance is selected according to desired data values. Each word line is connected through a switch to either of two voltage sources, GND or $V_{DD}$. Although the switches are shown as mechanical switches, it is understood by those skilled in the art that electronic switches would be used in constructing a ROS memory matrix according to the teachings of the present invention. The opposite end of each word line is connected to a suitable termination, T1, T2 ... TN.

Each bit line is connected to a decoder DC1 ... DCn and to a switch for connecting the bit lines to either of two voltage supplies, GND or $V_{DD}$.

Each memory cell consists of a resistive gate field effect transistor with one end of the resistive gate connected to a word line. The other end of the resistive gate is connected to the source or drain diffusion of the field effect transistor, the other of the source and drain diffusions is connected to a bit line. Operation of the ROS matrix will now be described. A memory location is selected by controlling the switches associated with the word and bit line. A selected device will have its source grounded and the word line end of its gate at greater than the threshold voltage Vt of the field effect transistor so that the device is conductive. Unselected devices are not conductive, either because their gates are grounded or because their sources and gates are both biased high, that is, at $V_{DD}$. As can be seen from FIG. 3, memory cell MC22 has been selected. With the switches in the positions shown in the figure, all other cells have not been selected for their associated transistors are non-conducting. For example, memory cell MC11 is not conducting for its word line is at ground level. However, the field effect transistor 2 associated with memory cell MC22 is conductive, for the word line WL2 is connected to the voltage $V_{DD}$ and its source is connected through the bit line BL2 to ground potential.

The decoder DC2 operates to measure the current $I_1$ flowing from word line WL2 through the resistive gate and channel region of memory cell MC22 and the bit line BL2.

There has been described a ROS array comprising a matrix of individual resistive gate field effect transistor devices having resistive gate electrodes. One end of the gate electrode of each memory device is connected to a word line, the other end of the gate to the drain of the field effect transistor. Bit lines are connected to the resistive gate field effect transistor source. A selected device has its source grounded and the word line end of its gate at a greater than threshold voltage so that the device conducts. The current passed by the selective device is a function of the resistance of the gate electrode plus the drain-source impedance. Devices are programmed by controlling the resistance of the gate electrodes by selective ion implantation at a late point in the manufacturing process. In this way, either binary or multilevel data can be stored according to the number of resistance levels selected for the resistive gates of the field effect transistors.

While the invention has been particularly shown and described with reference to the preferred embodiments thereof, it will be understood by those skilled in the art that there may be changes in form and detail without departing from the spirit and scope of the invention.

We claim:

1. A field effect transistor memory cell for a read only memory matrix having intersecting access and bit lines comprising:
   a field effect transistor having spaced source and drain regions and a channel region extending therebetween, and a resistive gate electrode insulated from and overlying said channel, one end of said resistive gate electrode being adapted for connection to an access line, the other end of said gate electrode being connected to one of said source and drain regions, the other of said source and drain regions being adapted for connection to a bit line, the resistance of said resistive gate determining the data level of said cell.

2. The field effect transistor memory cell as claimed in claim 1, wherein said resistive gate is made of polycrystalline material.

3. A read only memory matrix of intersecting access and data lines comprising:
   a plurality of memory cells for connection to the intersections of said access and data lines;
   each of said memory cells being composed of a field effect transistor having spaced source and drain regions and a channel region extending therebetween, and a resistive gate electrode insulated from and overlying said channel, one end of said resistive gate electrode being adapted for connection to an access line, the other end of said gate electrode being connected to one of said source and drain regions, the other of said source and drain regions being adapted for connection to a data line, the resistance of said resistive gate determining the data level of said cell;
   first switching means for selectively connecting each access line to a voltage supply;
   second switching means for selectively connecting each data line to a voltage supply;
   decoder means for determining the current flow through each of the data lines;
   the presence of a predetermined voltage difference between intersecting access and a data lines causing the resistive gate field effect transistor at the intersection to conduct, and produce a current from said access line through said field effect transistor to the data line which is a function of the resistance of the resistive gate electrode and the D.C. impedance of the channel region.

4. The read only memory matrix as claimed in claim 3, where the resistive gate of said field effect transistor is polycrystalliine silicon.

* * * * *

UNITED STATES PATENT AND TRADEMARK OFFICE
CERTIFICATE OF CORRECTION

PATENT NO.  : 4,583,201
DATED       : April 15, 1986
INVENTOR(S) : BERTIN et al

It is certified that error appears in the above-identified patent and that said Letters Patent is hereby corrected as shown below:

Column 1, Line 16     "sometimes calld"

should read     --sometimes called--

Column 3, Line 28     "$R_L \gg R_{FET}$"

should read     --$R_L \ll R_{FET}$--

Column 6, Line 39     "is polycrystalliine"

should read     --is polycrystalline--

Signed and Sealed this

Twenty-fifth Day of November, 1986

*Attest:*

DONALD J. QUIGG

*Attesting Officer*     *Commissioner of Patents and Trademarks*